US006812526B2

(12) United States Patent
Blanchard

(10) Patent No.: US 6,812,526 B2
(45) Date of Patent: Nov. 2, 2004

(54) TRENCH DMOS TRANSISTOR STRUCTURE HAVING A LOW RESISTANCE PATH TO A DRAIN CONTACT LOCATED ON AN UPPER SURFACE

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/144,214

(22) Filed: May 13, 2002

(65) Prior Publication Data

US 2002/0125527 A1 Sep. 12, 2002

Related U.S. Application Data

(63) Continuation-in-part of application No. 09/516,285, filed on Mar. 1, 2000, now Pat. No. 6,472,709.

(51) Int. Cl.[7] .............................................. H01L 29/76
(52) U.S. Cl. ........................ 257/343; 257/335; 257/337
(58) Field of Search ................................. 257/328–342

(56) References Cited

U.S. PATENT DOCUMENTS

| | | | |
|---|---|---|---|
| 5,124,764 A | 6/1992 | Mori ........................... | 357/23.4 |
| 5,416,350 A | 5/1995 | Watanabe .................... | 257/330 |
| 5,430,316 A | 7/1995 | Contiero et al. ............ | 257/335 |
| 5,640,034 A | 6/1997 | Malhi .......................... | 257/341 |
| 5,714,774 A * | 2/1998 | Otsuki et al. ............... | 257/138 |
| 5,882,966 A | 3/1999 | Jang ............................ | 438/234 |
| 6,072,215 A | 6/2000 | Kawaji et al. ............... | 257/334 |
| 6,124,612 A | 9/2000 | Tihanyi et al. .............. | 257/330 |

FOREIGN PATENT DOCUMENTS

JP  5-275464  10/1993  ......... H01L/21/338

* cited by examiner

Primary Examiner—Ori Nadav
(74) Attorney, Agent, or Firm—Mayer Fortkort & Williams, PC; David B. Bonham, Esq.; Karin L. Williams, Esq.

(57) ABSTRACT

A trench DMOS transistor structure having a low resistance path to a drain contact located on an upper surface and methods of making the same. The transistor structure comprises: (1) a first region of semiconductor material of a first conductivity type; (2) a gate trench formed within the first region; (3) a layer of gate dielectric within the gate trench; (4) a gate electrode within the gate trench adjacent the layer of gate dielectric material; (5) a drain access trench formed within the first region; (6) a drain access region of conductive material located within the drain access trench; (7) a source region of the first conductivity type within the first region, the source region being at or near a top surface of the first region and adjacent to the gate trench; (8) a body region within the first region below the source region and adjacent to the gate trench, the body region having a second conductivity type opposite the first conductivity type; and (9) a second region of semiconductor material within the first region below the body region. The second region is of the first conductivity type and has a higher dopant concentration than the first semiconductor region. Moreover, the second region extends from the gate trench to the drain access trench and is self-aligned to both the gate trench and the drain access trench.

12 Claims, 21 Drawing Sheets

TRENCH DMOS TRANSISTOR STRUCTURE HAVING A LOW RESISTANCE PATH TO A DRAIN CONTACT LOCATED ON AN UPPER SURFACE

STATEMENT OF RELATED APPLICATION

This application is a continuation-in-part of U.S. Ser. No. 09/516,285, filed Mar. 1, 2000, now U.S. Pat. No. 6,472,709 also entitled "TRENCH DMOS TRANSISTOR STRUCTURE HAVING A LOW RESISTANCE PATH TO A DRAIN CONTACT LOCATED ON AN UPPER SURFACE."

FIELD OF THE INVENTION

The present invention relates generally to MOSFET transistors and more generally to DMOS transistors having a trench structure.

BACKGROUND OF THE INVENTION

A DMOS (Double diffused MOS) transistor is a type of MOSFET (Metal Oxide Semiconductor Field Effect Transistor) that uses two sequential diffusion steps aligned to the same edge to form the channel region of the transistor. DMOS transistors are often high voltage, high current devices, used either as discrete transistors or as components in power integrated circuits. DMOS transistors can provide high current per unit area with a low forward voltage drop.

A typical discrete DMOS transistor structure includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is present on the sidewall of a trench, with the gate formed in the trench, which extends from the source towards the drain. The trench, which is lined with a thin oxide layer and filled with polysilicon, allows less constricted current flow than the vertical DMOS transistor structure and thereby provides lower values of specific on-resistance. Examples of trench DMOS transistors are disclosed in U.S. Pat. Nos. 5,072,266, 5,541,425, and 5,866,931.

One example is the low voltage prior art trench DMOS transistor shown in the cross-sectional view of FIG. 1. As shown in FIG. 1, trench DMOS transistor 10 includes heavily doped substrate 11, upon which is formed an epitaxial layer 12, which is more lightly doped than substrate 11. Metallic layer 13 is formed on the bottom of substrate 11, allowing an electrical contact 14 to be made to substrate 11. As is known to those of ordinary skill in the art, DMOS transistors also include source regions 16a, 16b, 16c, and 16d, and body regions 15a and 15b. Epitaxial region 12 serves as the drain. In the example shown in FIG. 1, substrate 11 is relatively highly doped with N-type dopants, epitaxial layer 12 is relatively lightly doped with N type dopants, source regions 16a, 16b, 16c, and 16d are relatively highly doped with N type dopants, and body regions 15a and 15b are relatively highly doped with P type dopants. A doped polycrystalline silicon gate electrode 18 is formed within a trench, and is electrically insulated from other regions by gate dielectric layer 17 formed on the bottom and sides of the trench containing gate electrode 18. The trench may extend into the heavily doped substrate 11 to reduce any resistance caused by the flow of carriers through the lightly doped epitaxial layer 12, but this structure also limits the drain-to-source breakdown voltage of the transistor. A drain electrode 14 is connected to the back surface of the substrate 11, a source electrode 22 is connected to the source regions 16 and the body regions 15 by source/body metal layer 23, and a gate electrode 19 is connected to the polysilicon 18 that fills the trench forming the gate.

Another example of a trench DMOS device is disclosed in U.S. Pat. No. 4,893,160 and shown in the cross-sectional view of FIG. 2. As shown in FIG. 2, partially completed trench DMOS device 30 includes substrate 11, epitaxial region 12, body regions 15a and 15b, and source regions 16a, 16b, 16c, and 16d. However, in comparison to the device shown in FIG. 1, N+ region 39 is added along the lower sides and bottom of trench 36, or alternatively just along the bottom of trench 36. At this step in the fabrication process, a layer of oxide 35 is present on the silicon surface. This structure improves the device performance by allowing carriers to flow through a heavily doped region at the bottom of the trench, thereby reducing the local resistance.

It would be desirable to provide further improvements to trench DMOS devices. For example, there is a need for a trench DMOS device that provides a low on-resistance and which is relatively simple and inexpensive to fabricate.

SUMMARY OF THE INVENTION

According to a first aspect of the invention, a trench MOSFET device is provided. The device comprises: (1) a first region of semiconductor material of a first conductivity type; (2) a gate trench formed within the first region; (3) a layer of gate dielectric within the gate trench; (4) a gate electrode within the gate trench adjacent the layer of gate dielectric material; (5) a drain access trench formed within the first region; (6) a drain access region of conductive material located within the drain access trench; (7) a source region of the first conductivity type within the first region, the source region being at or near a top surface of the first region and adjacent to the gate trench; (8) a body region within the first region below the source region and adjacent to the gate trench, the body region having a second conductivity type opposite the first conductivity type; and (9) a second region of semiconductor material within the first region below the body region. The second region is of the first conductivity type and has a higher dopant concentration than the first semiconductor region. Moreover, the second region extends from the gate trench to the drain access trench, and it is self-aligned to both the gate trench and the drain access trench.

The gate electrode can be formed of various conductive materials, for example, aluminum, alloys of aluminum, refractory metals, doped polycrystalline silicon, silicides, and combinations of polycrystalline silicon and refractory metals.

While the first region can be an epitaxial layer deposited on the semiconductor substrate (which is beneficially doped to the first conductivity type), an epitaxial layer is not necessary with the present invention. Hence, the first region can correspond to a semiconductor substrate, if desired.

The gate trench can take on a number of shapes. In some preferred embodiments, the gate trench has the shape of an octagonal, hexagonal, circular, square or rectangular mesh or lattice when viewed from above.

In some embodiments, the drain access trench is greater in width than the gate trench. In others, the drain access trench is of equal or lesser width than the gate trench.

The conductive material of the drain access region can comprise, for example, doped polycrystalline silicon, silicides and/or metal (for example, aluminum, refractory metals, and alloys thereof).

In certain embodiments, an oxide layer is provided adjacent the sidewalls of the drain access trench.

According to another aspect of the invention, a method of making a semiconductor device is provided. The method comprises: (a) providing a first region of semiconductor material of a first conductivity type; (b) etching a gate trench and a drain access trench within the first region; (c) forming a second semiconductor region within the first region, the second region: (i) extending from the gate trench to the drain access trench, (ii) being self-aligned to both the gate trench and the drain access trench, (iii) being of the first conductivity type, and (iv) having a higher dopant concentration than the first region; (d) forming a layer of gate dielectric material within the gate trench; (e) depositing a gate electrode within the gate trench adjacent the layer of gate dielectric material; (f) depositing a drain access region of conductive material within the drain access trench; (g) forming a body region within the first region above the second region and adjacent the gate trench, the body region having a second conductivity type opposite the first conductivity type; and (h) forming a source region of the first conductivity type above the body region and adjacent the gate trench.

In some embodiments, the gate trench and the drain access trench are formed simultaneously. In this case, the second semiconductor region is preferably formed using a single implantation step.

In other embodiments, the gate trench is formed in a different etching step from the drain access trench. In this case, the gate trench can be formed prior to the drain access trench, or vice versa. Moreover, a first implantation step can be performed after formation of the gate trench, and a second implantation steps can be performed after formation of the drain access trench. The drain access region can comprise a metal region and/or a polysilicon region.

In some embodiments, the gate and drain access trenches are formed prior to the formation of the body and source regions. In others, the gate and drain access trenches are formed subsequent to the formation of the body and source regions.

In some embodiments, a dielectric material layer is formed adjacent sidewalls of the drain access trench, in which case the dielectric material layer can be formed, for example, in the same process step as the gate dielectric material.

In some embodiments, the gate electrode is a doped polysilicon or silicide electrode, and the drain access region is a metal region.

In other embodiments, the gate electrode is a doped polysilicon or silicide electrode, and the drain access region at least partially comprises a doped polysilicon or silicide region. In these embodiments, the drain access region can be entirely formed of doped polysilicon or silicide, and the gate electrode and the drain access region can be formed in different polysilicon or silicide formation steps. Alternatively, the drain access region can partially comprise a doped polysilicon or silicide region that is introduced in the same polysilicon or silicide formation step as the gate electrode, in which case (a) the drain access region can further comprise an additional doped polysilicon or silicide region, which is introduced in a subsequent polysilicon or silicide formation step or (b) the drain access region can further comprise a metal region, which is introduced in a metal deposition step.

DETAILED DESCRIPTION

Figure 3:
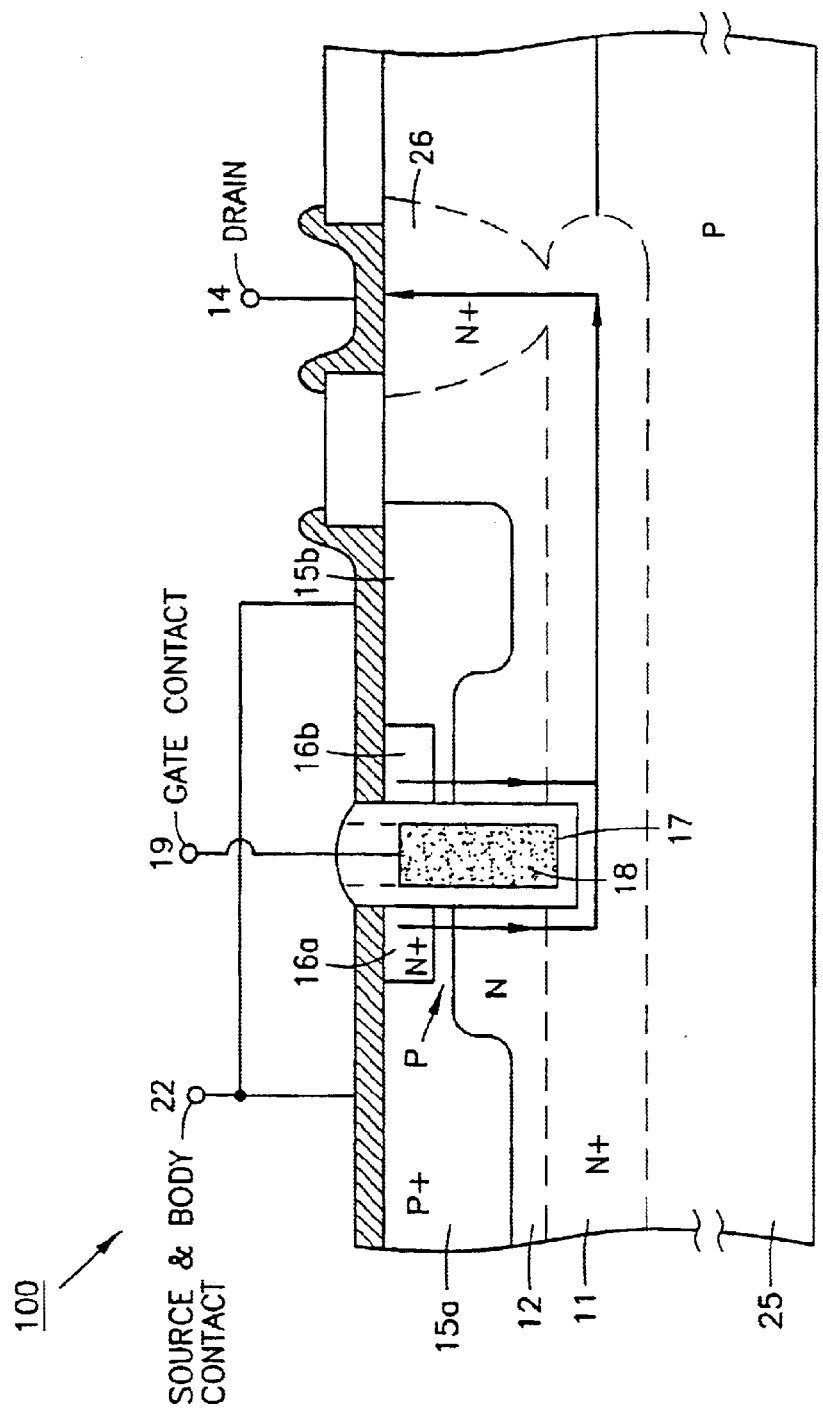
FIG. 3 shows a cross-sectional view of a trench DMOS transistor constructed in accordance with the prior art.

FIG. 3 shows a trench DMOS transistor 100 constructed in accordance with the prior art. One notable advantage of this structure is that because it is self-isolated it can be used not only in discrete components but also in integrated circuits. However, it requires the formation of a buried layer and the deposition of an epitaxial layer. As shown in FIG. 3, trench DMOS transistor 100 includes a substrate 25, heavily doped buried region 11, and an epitaxial region 12, which is more lightly doped than buried region 11. While the substrate 25 may be N-type or P-type, a P-type substrate will typically be preferred when the structure is to be incorporated into an integrated circuit, since junction isolated devices may be readily fabricated. The DMOS transistor also includes source regions 16a and 16b and body regions 15a and 15b. As is well known to those of ordinary skill in the art, the body regions 15a, 15b may include a deeper more heavily doped region and a shallower, more lightly doped region. In the example shown in FIG. 3, buried region 11 is relatively highly doped with N type dopants, epitaxial region 12 is relatively lightly doped with N type dopants, source regions 16a and 16b relatively highly doped with N type dopants, and body regions 15a and 15b include portions that are relatively highly doped and relatively lightly doped with P type dopants.

A polycrystalline silicon gate electrode 18, which is formed within a trench, is electrically insulated from other regions by a gate dielectric layer 17 formed on the bottom and sides of the trench containing gate electrode 18. The trench extends into the heavily doped buried region 11. In contrast to the structures shown in FIGS. 1 and 2, in this device the drain electrode is located on the top surface rather than the back surface of the structure. More specifically, a drain access region 26 extends from the top surface of the device to the heavily doped buried region 11. The drain access region 26 is heavily doped and of the same conductivity type as the buried region 11. The drain access region provides a low resistance path from the heavily doped buried region 11 to a drain electrode 14.

Figure 1:
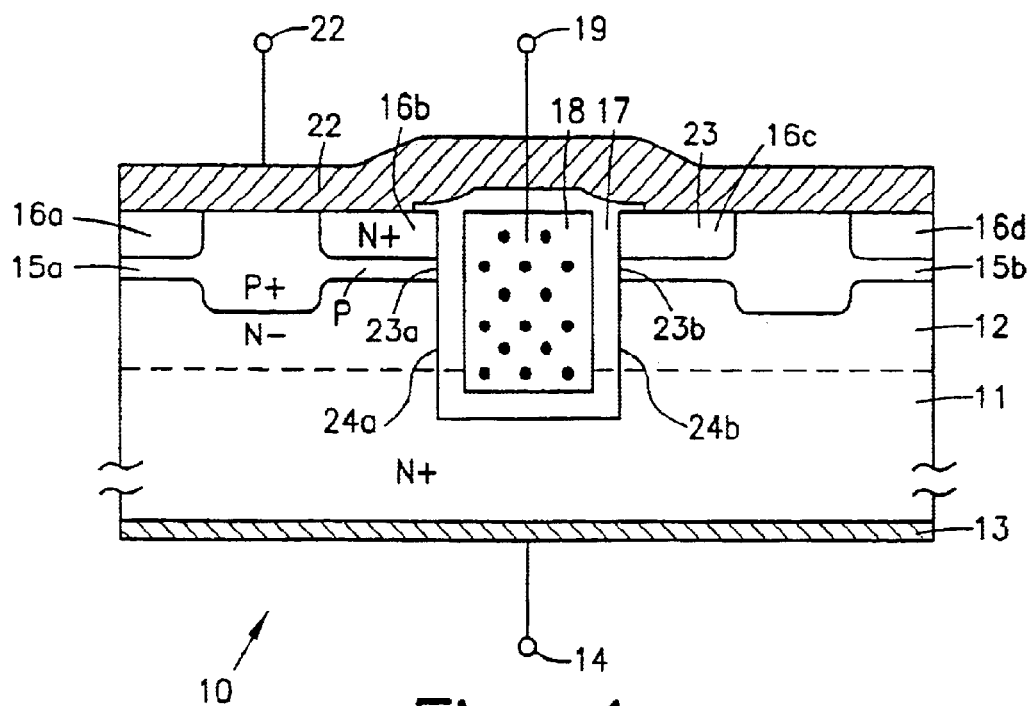
FIGS. 1 and 2 each show cross-sectional views of a conventional trench DMOS transistor.
Figure 2:
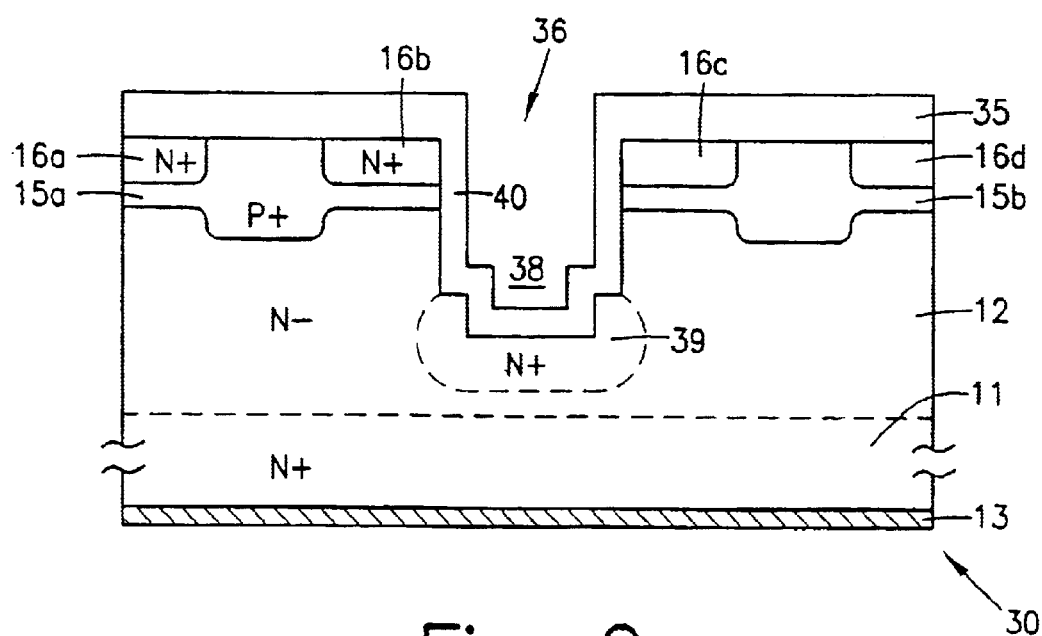

Finally, similar to the devices shown in FIGS. 1 and 2, a source and body electrode 22 is connected to the source regions 16 and the body regions 15 through source and body metal layer 23, and a gate electrode 19 is connected to the polysilicon 18 that fills the trench.

One problem with the device structure shown in FIG. 3 is that it can be relatively expensive to manufacture because it requires the deposition of an epitaxial layer, i.e., region 12, which is inherently expensive to produce.

Figure 4:
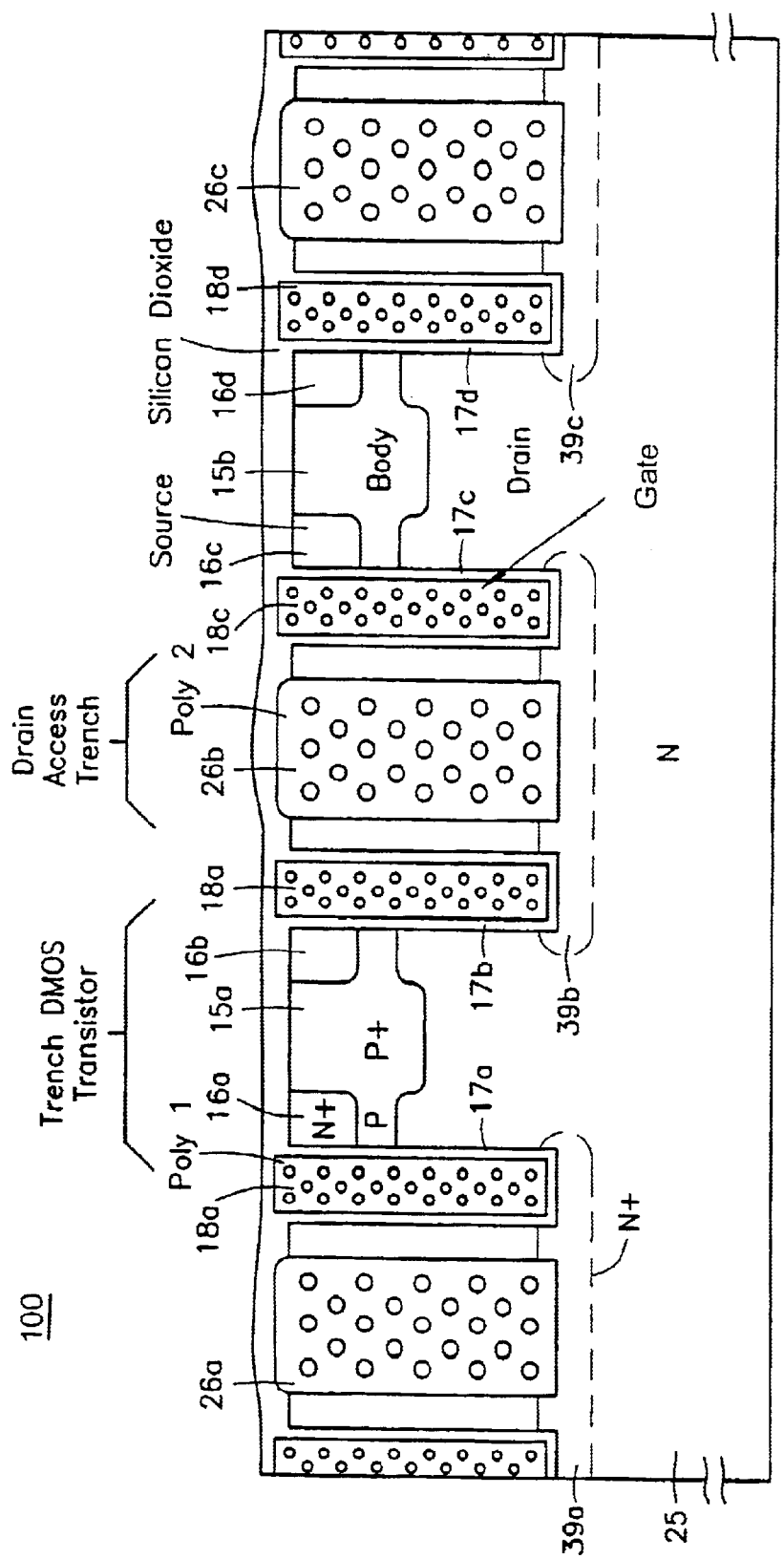
FIG. 4 shows an embodiment of the trench DMOS transistor constructed in accordance with the present invention.

According to an embodiment of the present invention, depicted in FIG. 4, the epitaxial region 12 is eliminated so that fabrication of the device is considerably simplified. As shown in FIG. 4, trench DMOS transistor 100 includes a substrate 25 in which the device is formed. Similar to the previously depicted structures, the DMOS transistor shown in FIG. 4 includes source regions 16a, 16b, 16c and 16d and body regions 15a and 15b. As is commonly the case, in the example shown in FIG. 4, substrate 25 is doped with N-type dopants (although alternatively, P-type dopants may be used), source regions 16a, 16b, 16c, and 16d are relatively highly doped with N type dopants, and body regions 15a and 15b are both relatively highly doped and relatively lightly doped with P type dopants. Polycrystalline silicon gate electrodes 18a, 18b, 18c and 18d are each formed within a gate trench. The gate electrodes 18a, 18b, 18c and 18d are electrically insulated from other regions by gate dielectric layers 17a, 17b, 17c and 17d formed on the bottom and sides of each respective gate trench. Additional trenches defining drain access regions 26a, 26b, and 26c also extend from the top surface of the device.

A low resistance path for the drain is provided by adding heavily doped regions along the lower sides and bottom of the gate trenches and the drain access trenches, or alternatively, only along the bottom of the gate trenches and drain access trenches. The heavily doped regions merge laterally, forming continuous, heavily doped regions 39a, 39b and 39c that extend from the bottom of each gate trench to its associated drain access trench. The drain access regions 26a, 26b and 26c are preferably heavily doped with the same conductivity type dopant as heavily doped regions 39a, 39b and 39c. The drain access regions 26a, 26b and 26c provide low resistance paths from the heavily doped regions 39a, 39b and 39c to the drain electrode, which is preferably located on the top surface of the device.

As will be discussed in more detail in connection with FIGS. 5a–5d, the heavily doped regions 39a, 39b and 39c are preferably formed by diffusing a species such as phosphorous and/or arsenic through the gate and access trenches before they are filled with polysilicon. The gate and drain access trenches should be sufficiently close to one another to ensure that the dopants diffusing therethrough merge together to form the continuous, low resistance path between the trenches. These heavily doped regions are self-aligned to the bottoms of the gate and the drain access trenches.

As previously mentioned, the structure shown in FIG. 4 advantageously eliminates the need for an epitaxial layer 12 as well as the need for a layer formed below the epitaxial layer, such as the region 11 shown in FIG. 3.

Figure 5A:
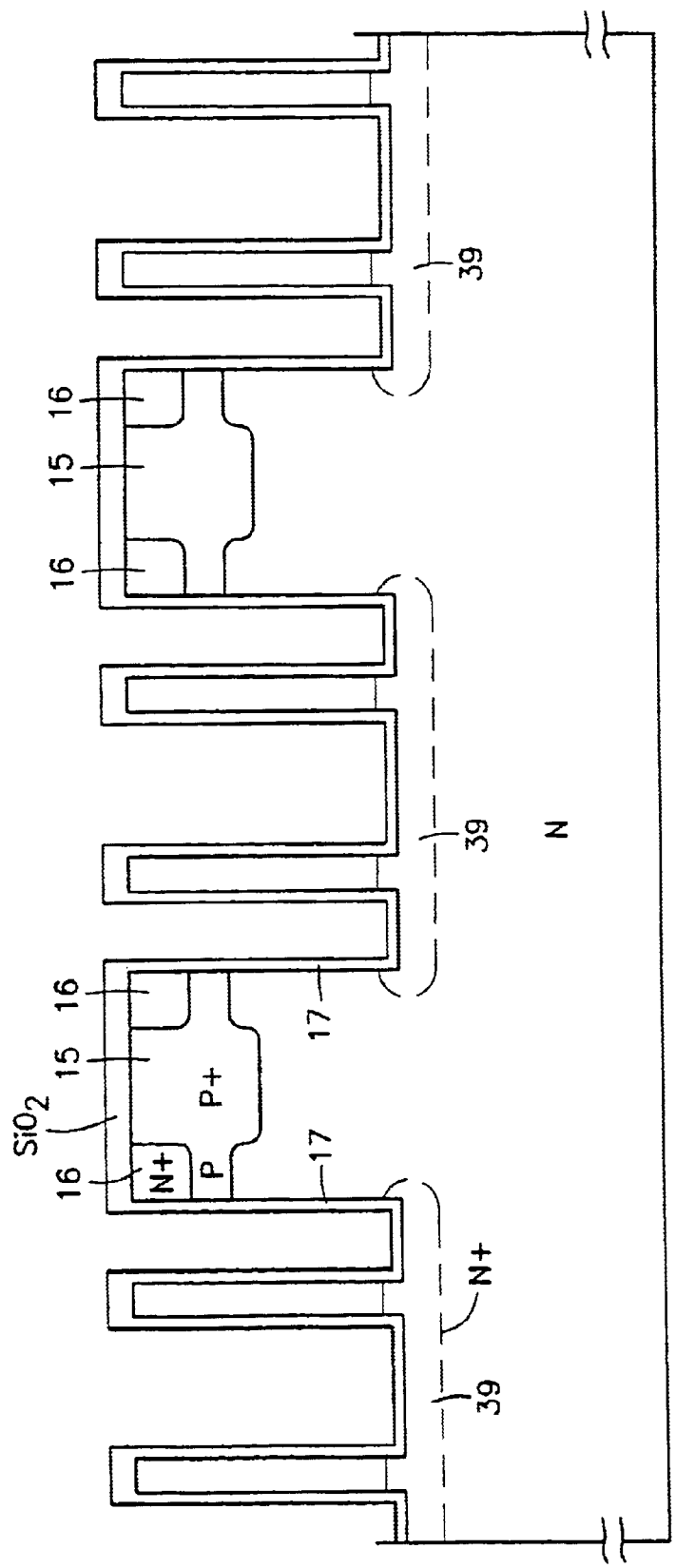
FIGS. 5a–5d illustrate a sequence of process steps forming the trench DMOS transistor shown in FIG. 4.

The inventive DMOS devices shown in FIG. 4 may be fabricated in accordance with conventional trench DMOS processing techniques with the appropriate modification of the deposition and etching steps. For example, the FIG. 4 device begins by forming the bodies 15a and 15b and the source regions 16a–16d in diffusion steps and the gate and drain access trenches in etching steps. Additional details concerning such steps may be found, for example, in previously mentioned U.S. Pat. No. 4,893,160. Next, a dielectric layer 17 such as a silicon dioxide layer is grown in the trenches, followed by the introduction of a diffusing species, e.g., an n-type species such as phosphorous or arsenic, to the bottom of the trenches by a technique such as ion implantation. The diffusing species is then diffused to form the continuous, heavily doped regions 39. FIG. 5a shows the structure at the end of this stage of fabrication with the heavily doped regions 39 self-aligned to the bottoms of the trenches.

Figure 5B:
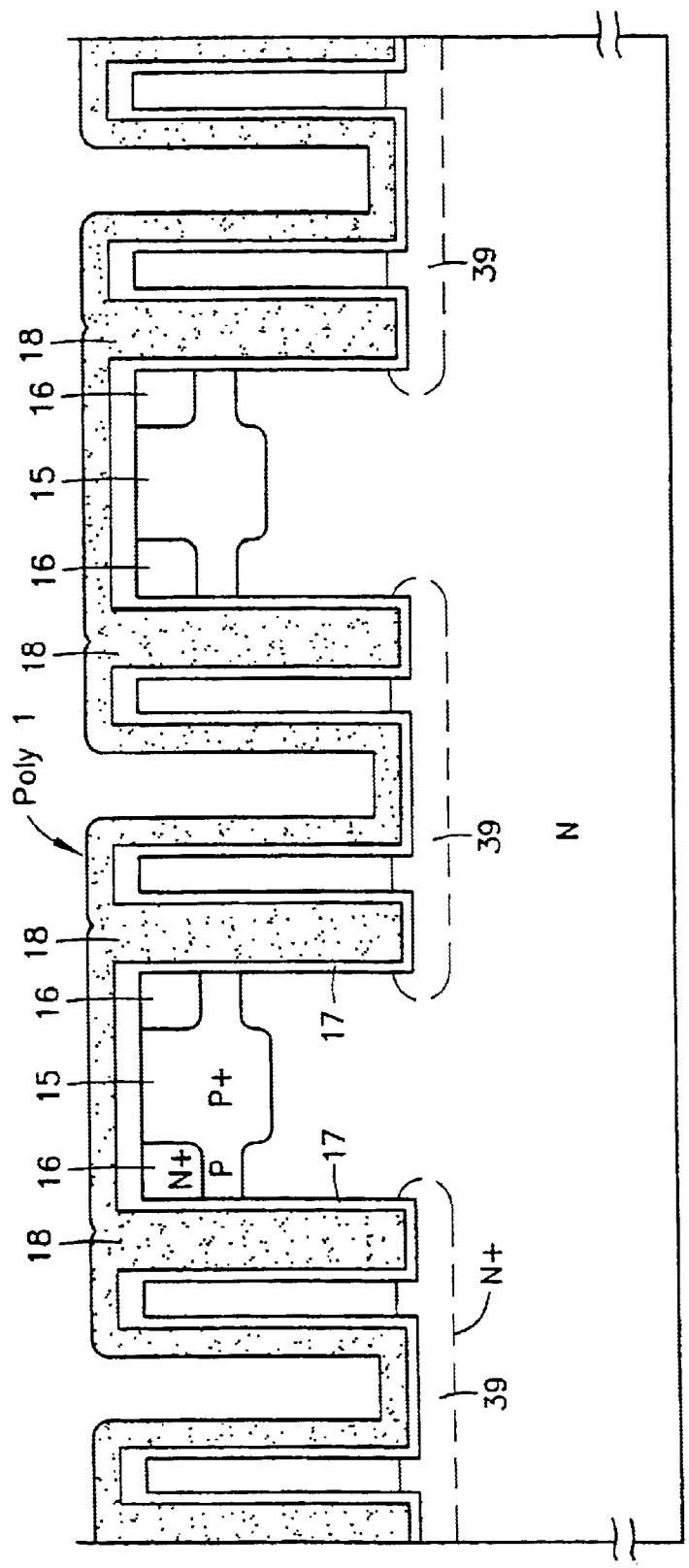
Figure 5C:
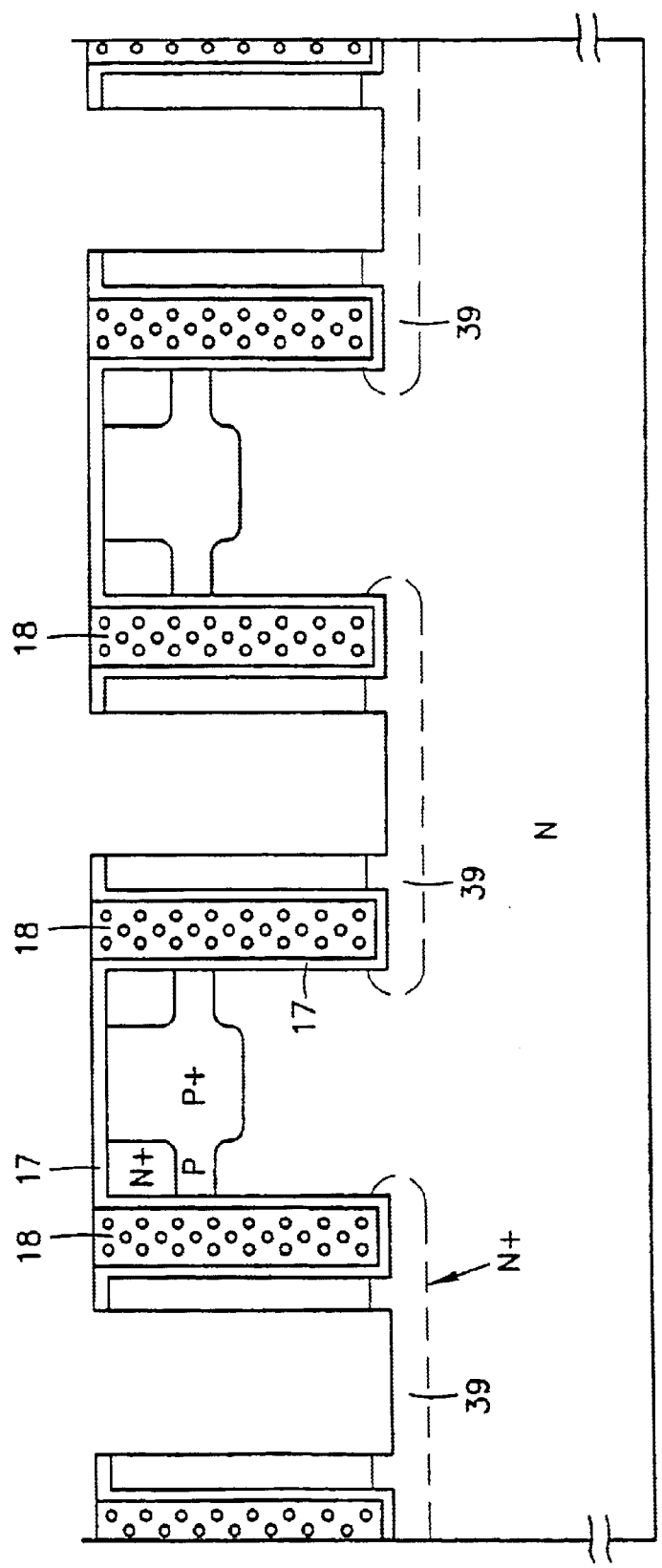

Next, as shown in FIG. 5b, the gate trenches are filled and the drain access trenches are partially filled with doped polysilicon 18. As is well known to those of ordinary skill in the art, polysilicon will more quickly fill a narrow trench of a given depth than a wider trench of the same depth, since it deposits in an essentially uniform layer. Accordingly, in some embodiments of the invention such as those shown in the figures, it may be desirable to make the width of the drain access trench greater than the width of the gate trench. In this way, as shown in FIG. 5b, when the gate trench is filled with polysilcon (polycrystalline silicon) the drain access trench will be only partially full.

Figure 5D:
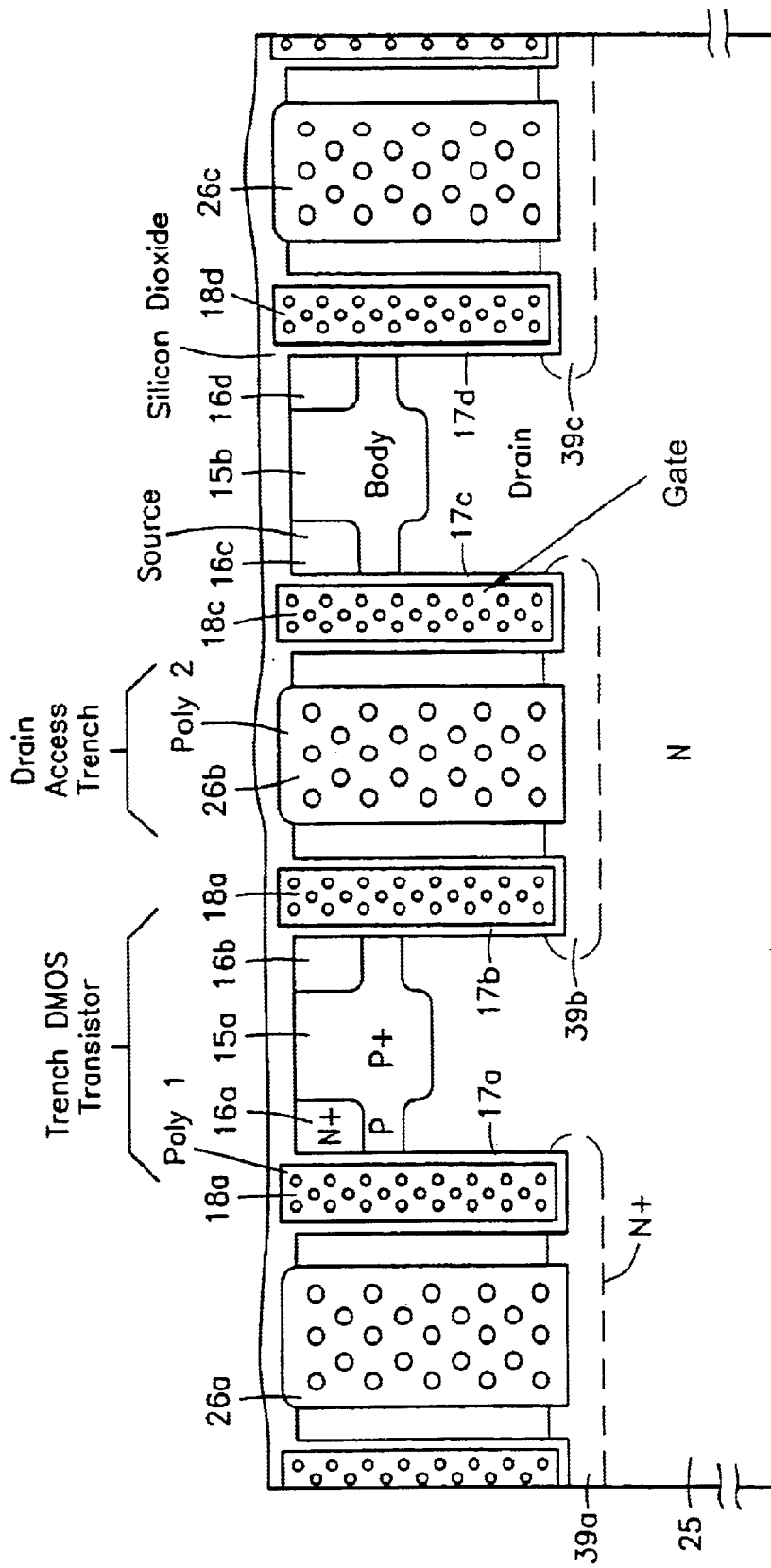

In either case, after the gate trench is filled with polysilicon, an isotropic etch is used, which removes the polysilicon in the drain access trenches while leaving it in the gate trenches. A subsequent etch process is employed to remove the silicon oxide layer lining the drain access trench producing the device of FIG. 5c. Next, as shown in FIG. 5d, the drain access trench is filled with N type doped polysilicon using CVD, which also covers the surface of the wafer. An isotropic etch is preformed to form the drain access region 26. A conductor other than doped polysilicon, for example, a metal conductor, can also be used to fill the trench.

Figure 6:
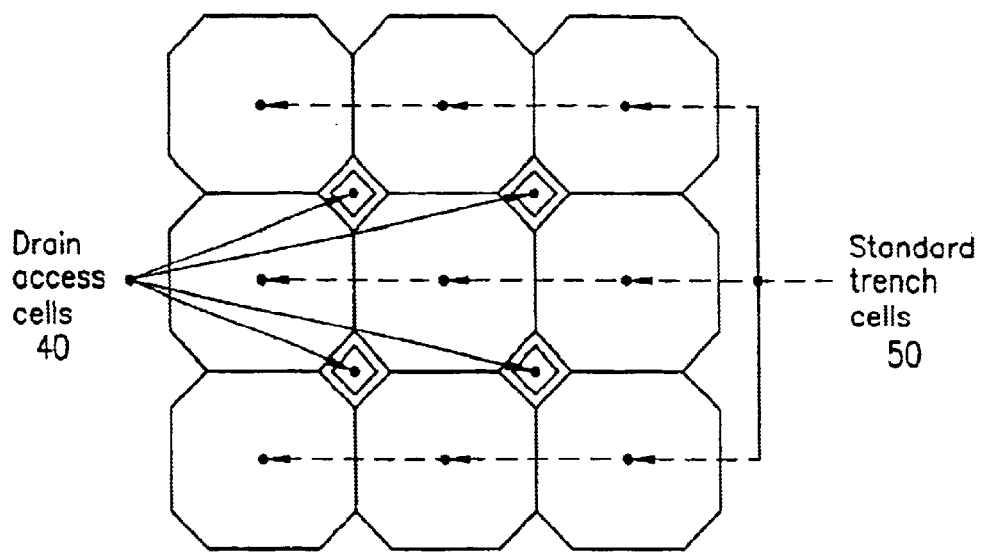
FIGS. 6–8 show top views of various geometries in which a plurality of trench DMOS transistors constructed in accordance with the present invention may be arranged.
Figure 7:
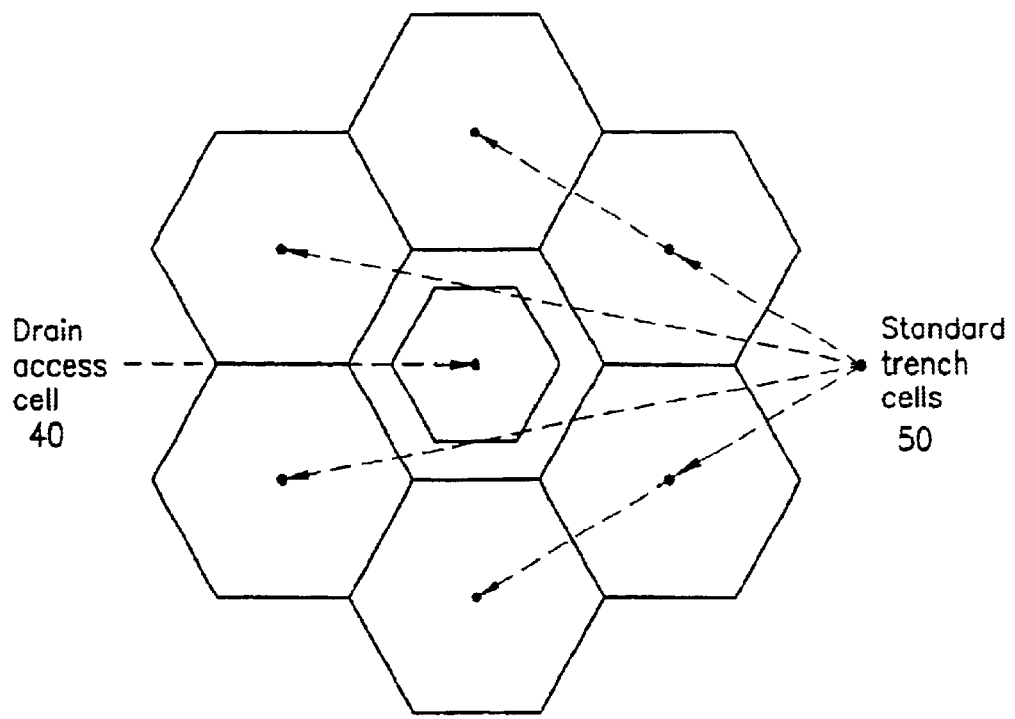
Figure 8:
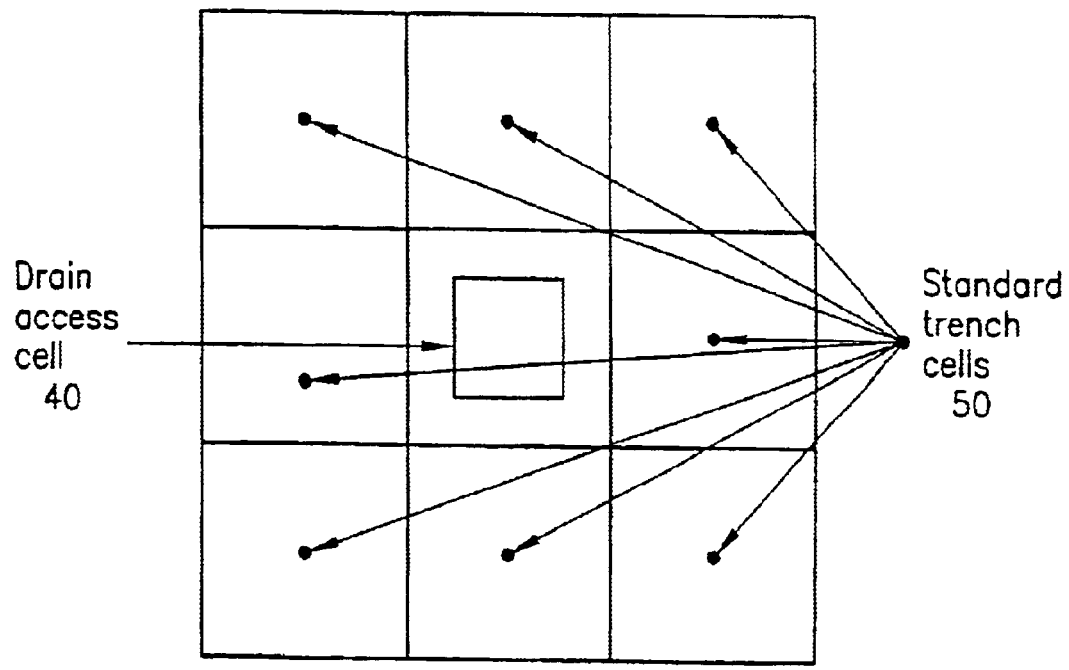

FIGS. 6–8 show top views of various surface geometries in which a plurality of the inventive DMOS transistors may be arranged. The arrangements include drain access cells 40 and transistor cells 50. The drain access cells 40 denote the structure defined by the drain access trench and the adjacent gate trenches, which are interconnected by the low resistance path at the bottom of the drain access trench and the surrounding transistor cells. The transistor cells 50 denote the structure defined by the conventional DMOS transistor structure, which includes the gate trenches, the source regions and the body region. While these or any other geometries may be employed, the octagonal arrangement shown in FIG. 6 is particularly advantageous because it allows the relative areas occupied by the transistor cells and the drain access cells to be adjusted independently of one another so that a minimum device on-resistance can be achieved.

Various processing schemes have been developed, in addition to the processing scheme set forth above in connection with FIGS. 5a–5d, for the production of various devices in accordance with the present invention.

For example, referring now to FIGS. 9a–9d, a layer of silicon oxide, preferably silicon dioxide, can be deposited over a structure like that illustrated in FIG. 5b, covering the structure and filling the trenches that are only partially filled with polycrystalline silicon. The silicon dioxide layer is then etched using techniques known in the art, for example, plasma etching, to produce silicon dioxide regions 24. The trenches are preferably filled with silicon dioxide regions 24 at this point to provide a planarized structure, which, in turn, improves the quality of subsequent masking steps.

This structure is then subjected to a plasma silicon etching step to remove the exposed polycrystalline silicon at the top surface of the structure, producing polysilicon regions 18. Then, the exposed polycrystalline silicon that remains is oxidized, for example, using a wet or dry oxidation step, to form a thin oxide layer 27 on the polycrystalline silicon regions 18, as illustrated in FIG. 9a.

Figure 9A:
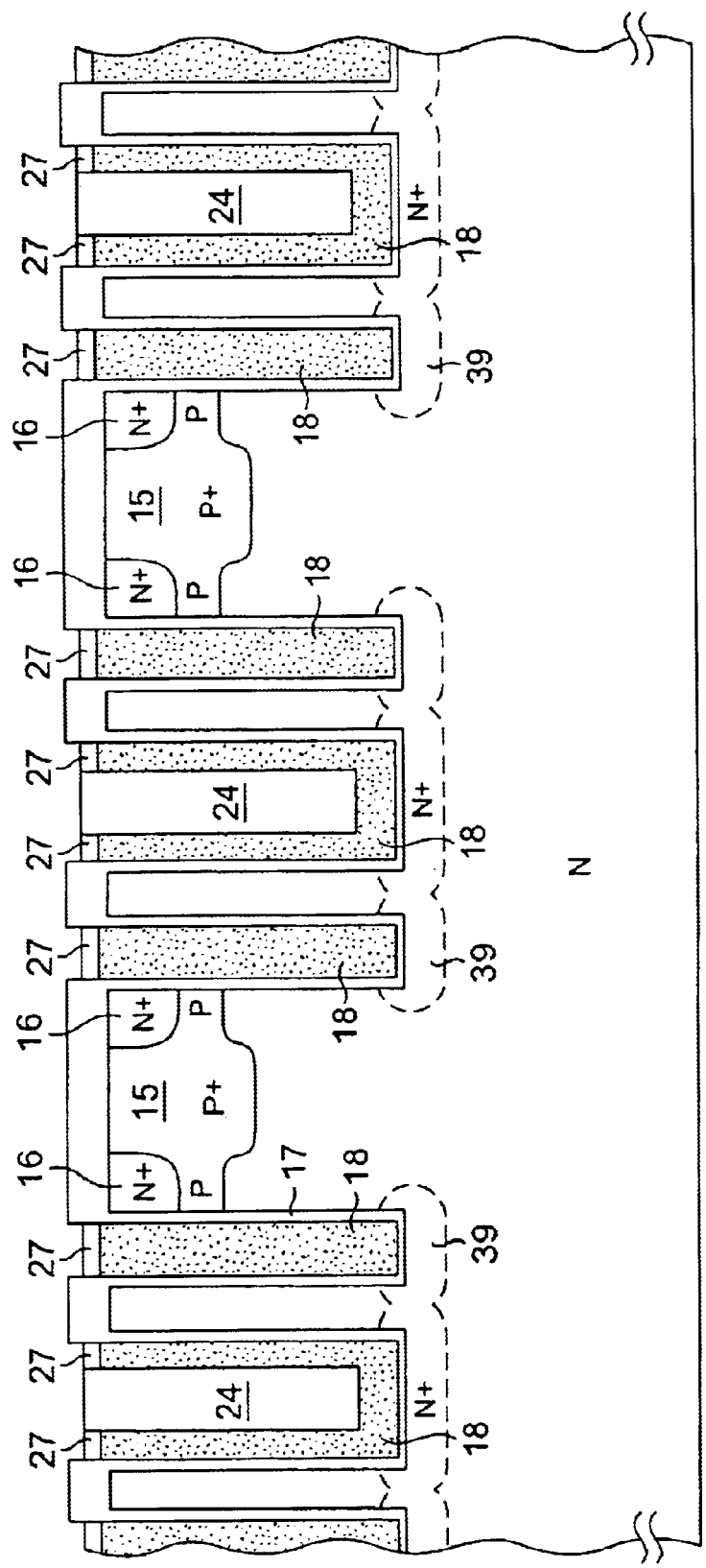
FIGS. 9a–9d illustrate a sequence of process steps for forming a trench DMOS transistor in accordance with an embodiment of the present invention.
Figure 9B:
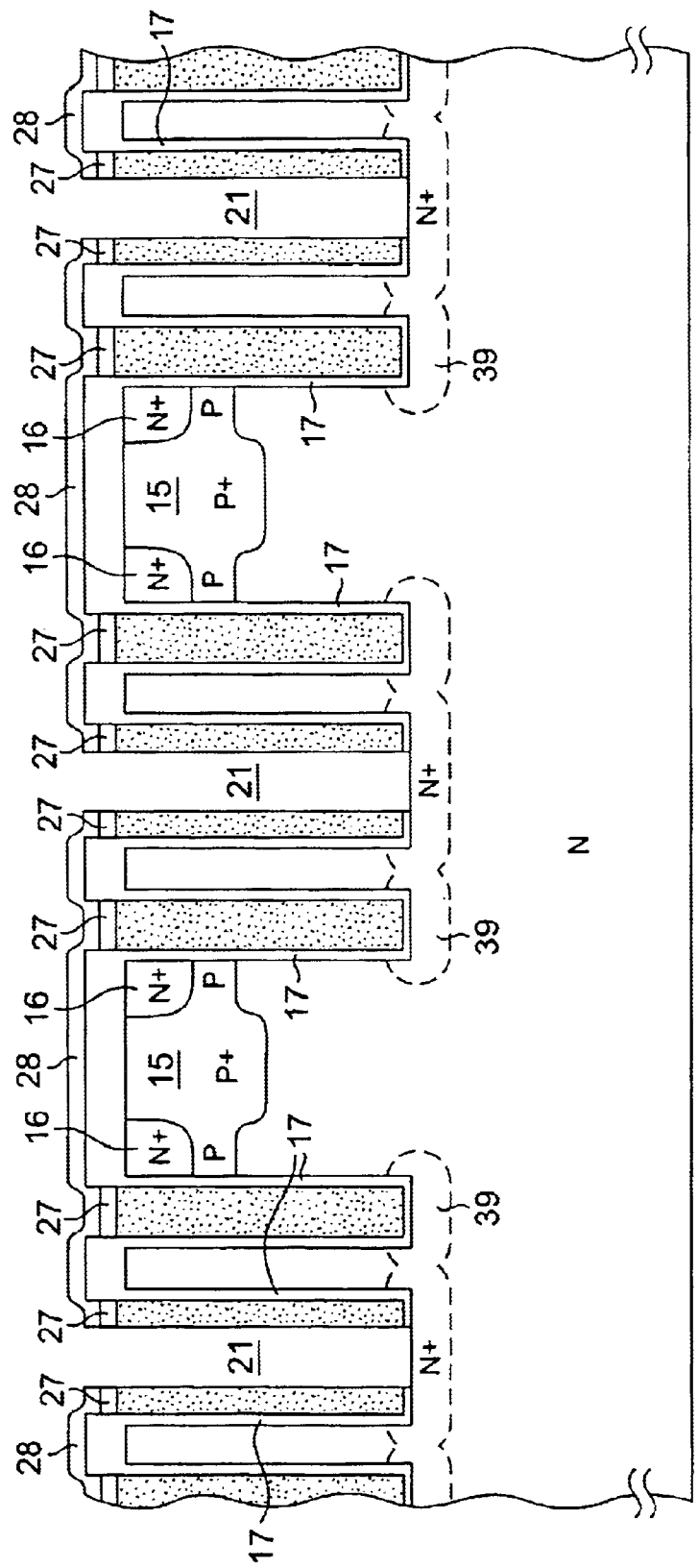

A masking layer, such as a silicon nitride layer, is then deposited over the structure of FIG. 9a. This layer is then, in turn, masked and etched as is known in the art, producing a patterned masking layer 28. The silicon dioxide regions 24 of FIG. 9a are then etched through apertures in the patterned masking layer 28 using an anisotropic plasma silicon dioxide etching step. (Alternately, thin oxide layer 27 is not formed, and nitride layer 28 is masked and etched, eliminating the need for an anisotropic oxide etch.) After this, the polysilicon at the trench bottom is likewise anisotropically etched. Finally, the silicon dioxide layer at the trench bottom is anisotropically etched, completing the formation of trenches 21, illustrated in FIG. 9b.

Figure 9C:
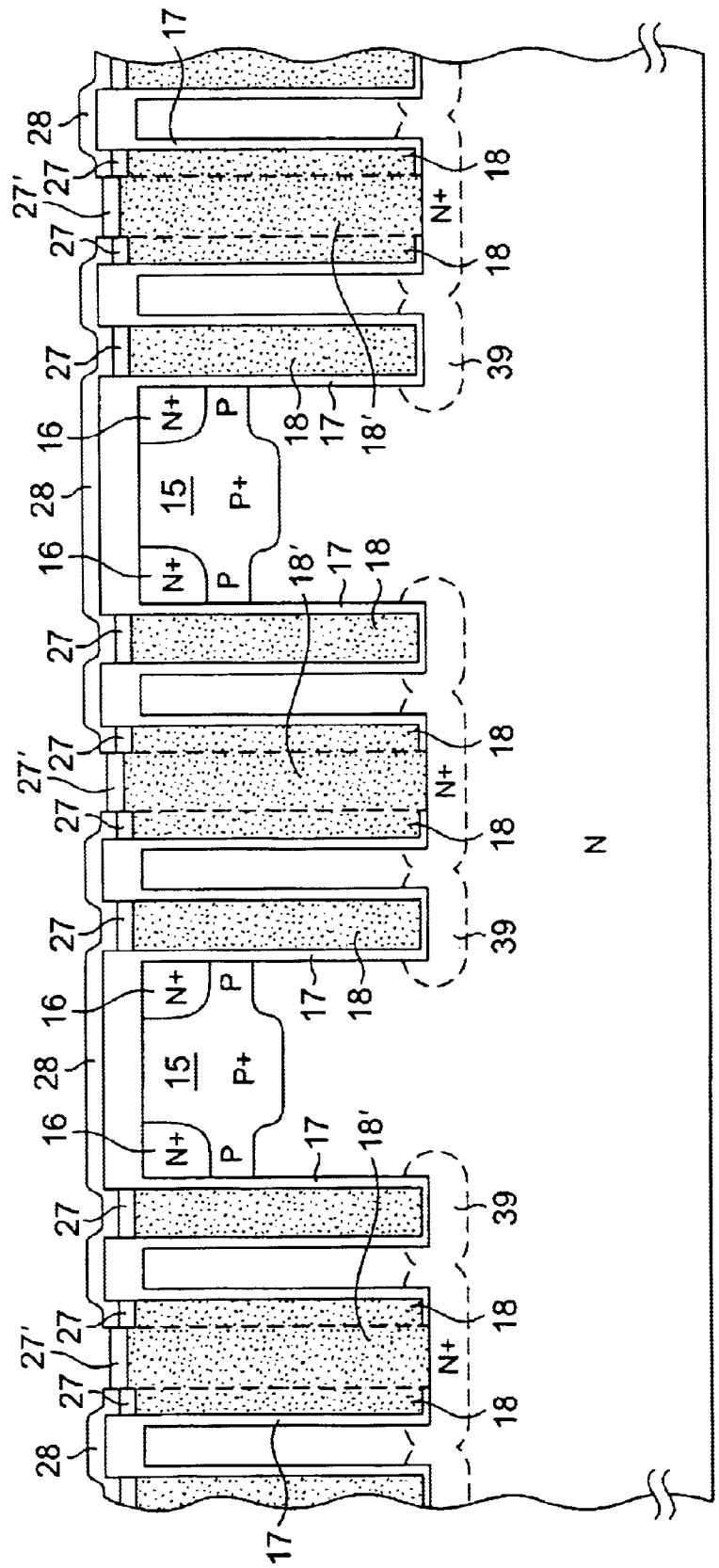

A layer of doped polycrystalline silicon is then deposited, covering the structure and filling the trenches 21. This polycrystalline silicon layer is etched in a plasma etching step, planarizing the overall structure and producing polysilicon regions 18'. Finally, the exposed polycrystalline silicon is oxidized, for example, using a wet or dry oxidation step, to form a thin oxide layer 27' on the newly exposed polycrystalline silicon regions 18' as illustrated in FIG. 9c. As discussed below in connection with FIG. 9d, the thin oxide layer 27' is removed in a subsequent contact etching step. Hence, the above step of forming the thin oxide layer 27' is clearly an optional one. However, by forming the thin oxide layer 27' over the polycrystalline silicon regions 18', the issue of photoresist adhesion to polysilicon, a problem well known in the art, is effectively addressed.

Although the structure of FIG. 9c is similar to that illustrated in FIG. 5d, substantially different processing steps were used in their production. The process leading to the structure of FIG. 9c is advantageous relative to that leading to the structure of FIG. 5d, because the polysilicon along the drain access trench sidewall is retained, reducing the likelihood of processing problems that reduce process yield.

Figure 9D:
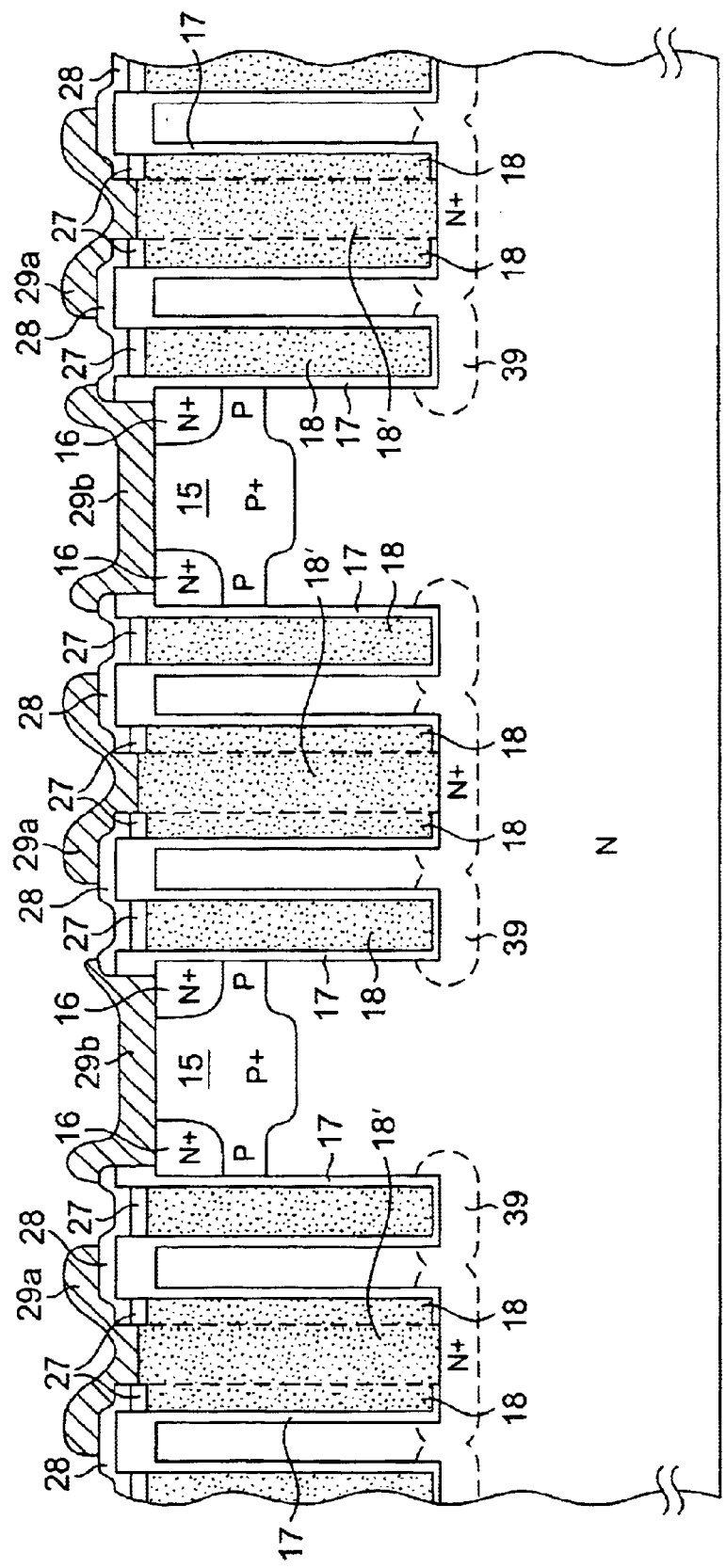

Referring now to FIG. 9d, a masking layer (not shown) is preferably applied and patterned using techniques known in the art. Silicon dioxide regions, and in some areas, silicon nitride regions as well, are then etched through apertures in the patterned masking layer, for example, using plasma etch techniques, or wet etches such as buffered oxide and phosphoric acid, forming contact openings. Finally, a conductive layer, for example, a metal layer such as aluminum, aluminum-copper, or aluminum-copper-silicon, is deposited over the structure, masked and etched using techniques known in the art to produce drain contact regions 29a and source/body contact regions 29b as illustrated in FIG. 9d, as well as gate contacts (not shown), completing the structure.

Figure 10A:
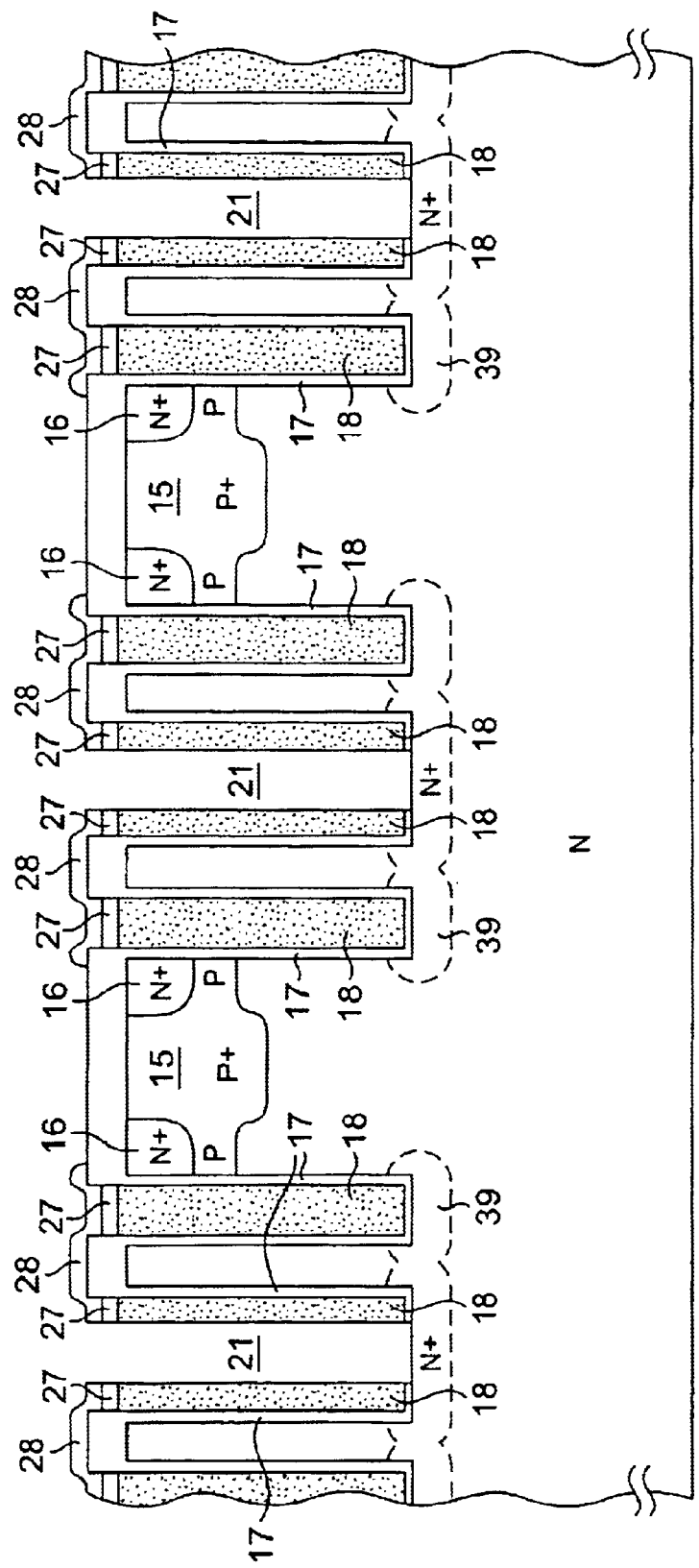
FIGS. 10a–10b illustrate a sequence of process steps for forming a trench DMOS transistor in accordance with another embodiment of the present invention.
Figure 10B:
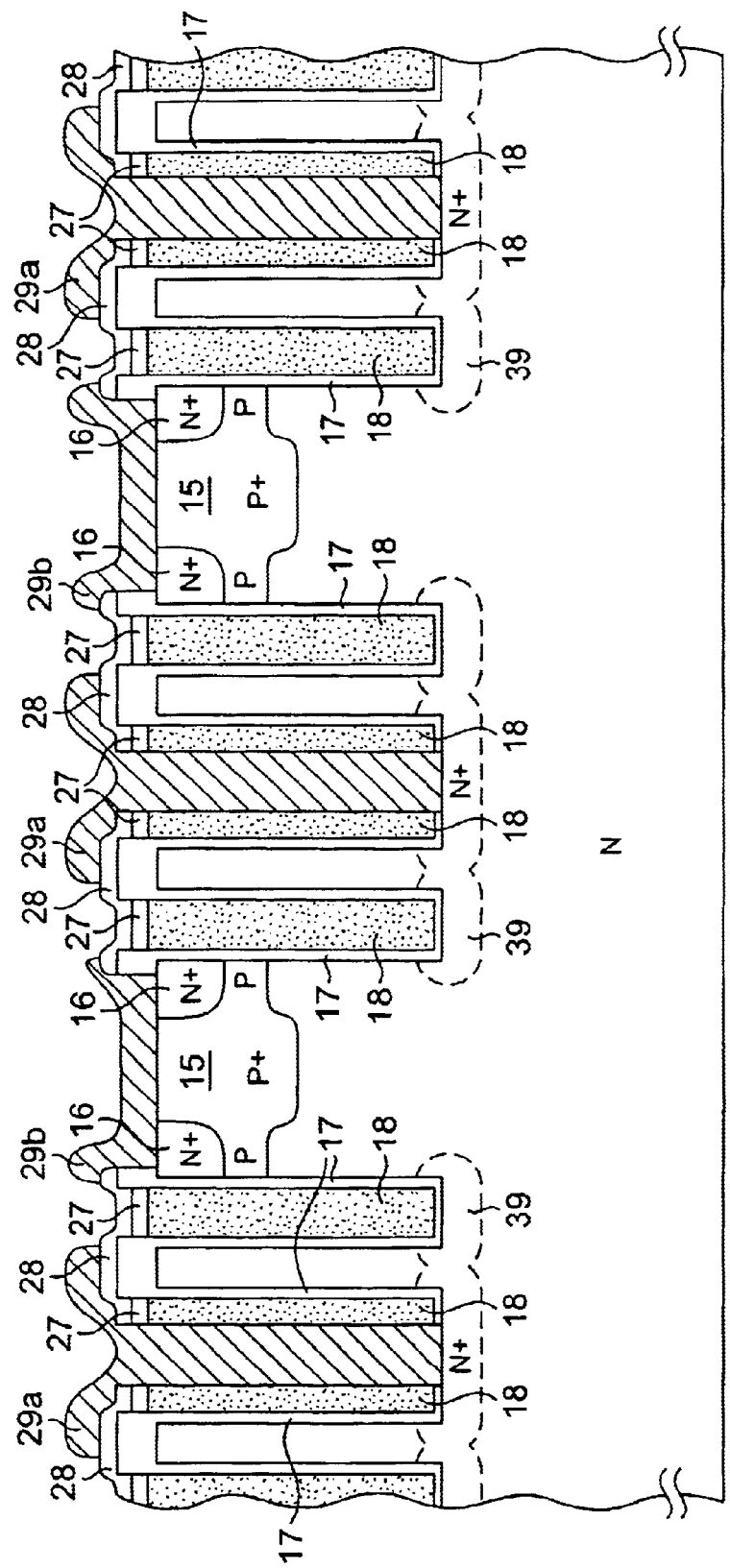

A further device design and processing scheme will now be discussed in connection with FIGS. 10a and 10b. Beginning with a structure like that of FIG. 9a above, a masking layer, such as a silicon nitride layer, is deposited, masked and etched as is known in the art, producing a patterned masking layer 28. The silicon dioxide regions 24 (see FIG. 9a), which have a significantly higher etch rate than thermally grown oxide, are then etched through apertures in the patterned masking layer 28 using an anisotropic silicon dioxide etching step. After this, the polysilicon at the trench bottom is likewise anisotropically etched. Finally, the silicon dioxide layer at the trench bottom is etched, completing the formation of trenches 21, to produce the structure of FIG. 10a. (As with the process sequence in FIG. 9, the growth of thin oxide layer may be eliminated, removing the need for an anisotropic etch.)

Silicon dioxide regions over the source/body regions are etched without the need for an additional mask, for example, using a buffered oxide etching step. Finally, a conductive layer, for example, a metal layer such as aluminum, aluminum-copper, aluminum-copper-silicon or tungsten, is deposited over the structure, covering the structure and filling the trenches 21. The metal layer is then masked and etched, using techniques known in the art, to produce drain contact regions 29a and source/body contact regions 29b as illustrated in FIG. 10b. The structure of FIG. 10b is advantageous relative to that of FIG. 9d, for example, in that lower resistance drain contacts are produced. (As an alternative example, one metal such as tungsten may be used, with suitable liner layers such as Ti/TiN to fill the trench, and a second metal or set of metals may be used as the metal on the surface.)

Figure 11A:
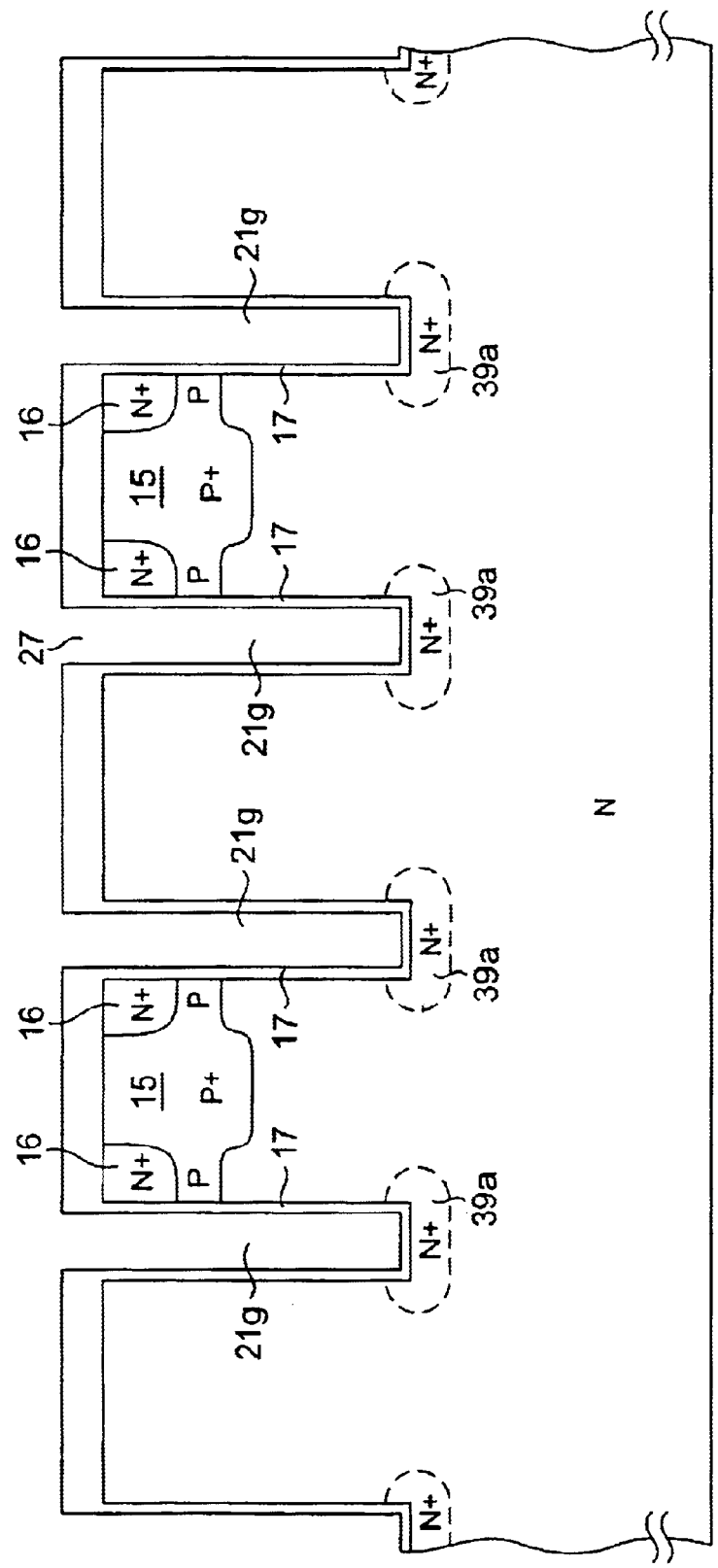
FIGS. 11a–11f illustrate a sequence of process steps for forming a trench DMOS transistor in accordance with another embodiment of the present invention.

Yet another device design and processing scheme will now be discussed in connection with FIGS. 11a–11f. As in FIG. 5a, bodies 15 and source regions 16 are first formed in implantation/diffusion steps and gate trenches 21g are formed in etching steps. Next, a dielectric layer 17, such as a silicon dioxide layer, is grown in the trenches and on the upper surface, followed by the introduction of a diffusing species, e.g., an n-type species such as phosphorous, to the bottom of the trenches by a technique such as ion implantation. The diffusing species is then diffused to form heavily doped regions 39a. FIG. 11a shows the structure at the end of this stage of fabrication. This structure differs from the structure of FIG. 5a in that the wide drain access trenches of FIG. 5a are not formed at this stage of device fabrication.

Next, doped polysilicon is provided over the structure, filling the gate trenches 21g. The doped polysilicon layer is subsequently etched in a plasma etch process, creating doped polysilicon regions 18. Then, the remaining exposed polycrystalline silicon is oxidized, for example, using a wet or dry oxidation step, to form a thin oxide layer 27 on the polycrystalline silicon regions 18, as illustrated in FIG. 11b.

Figure 11B:
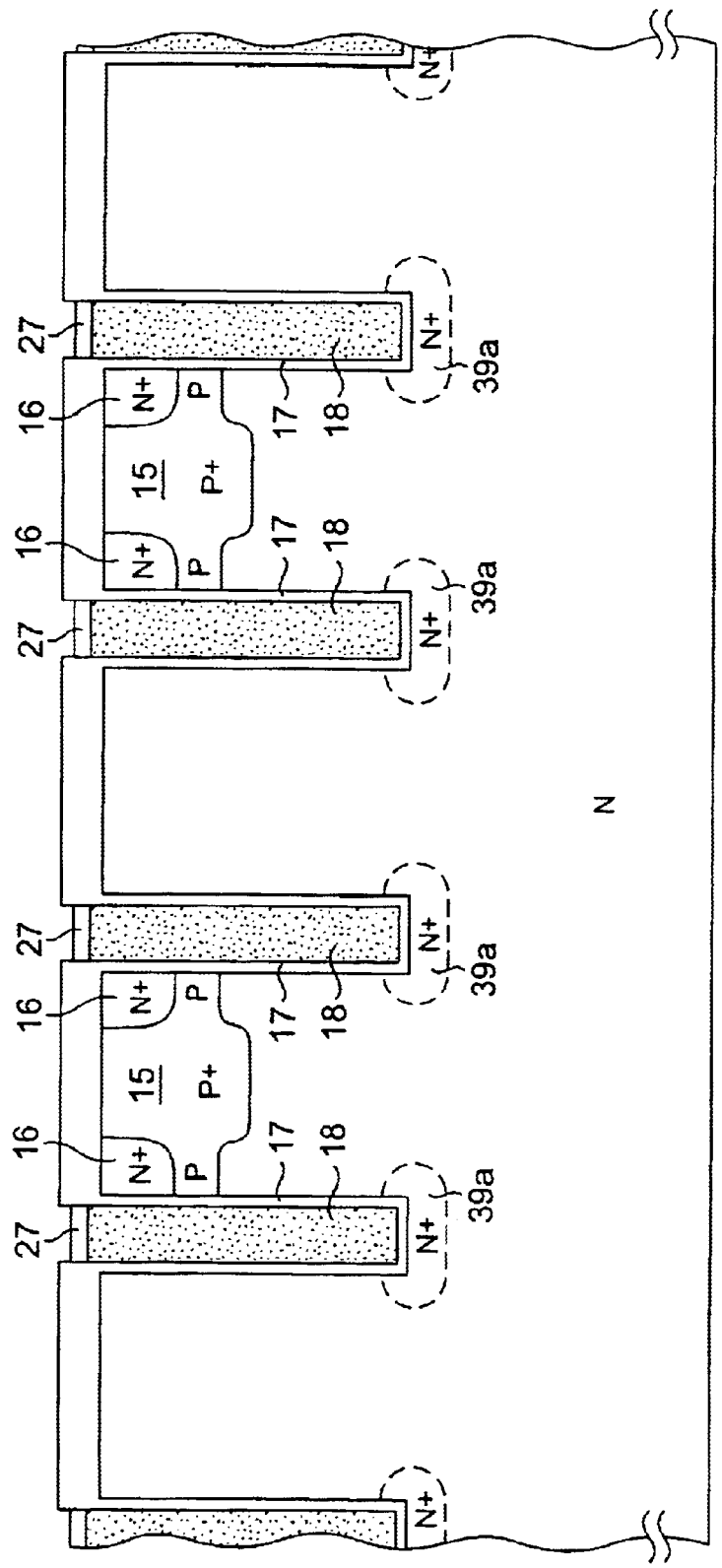
Figure 11C:
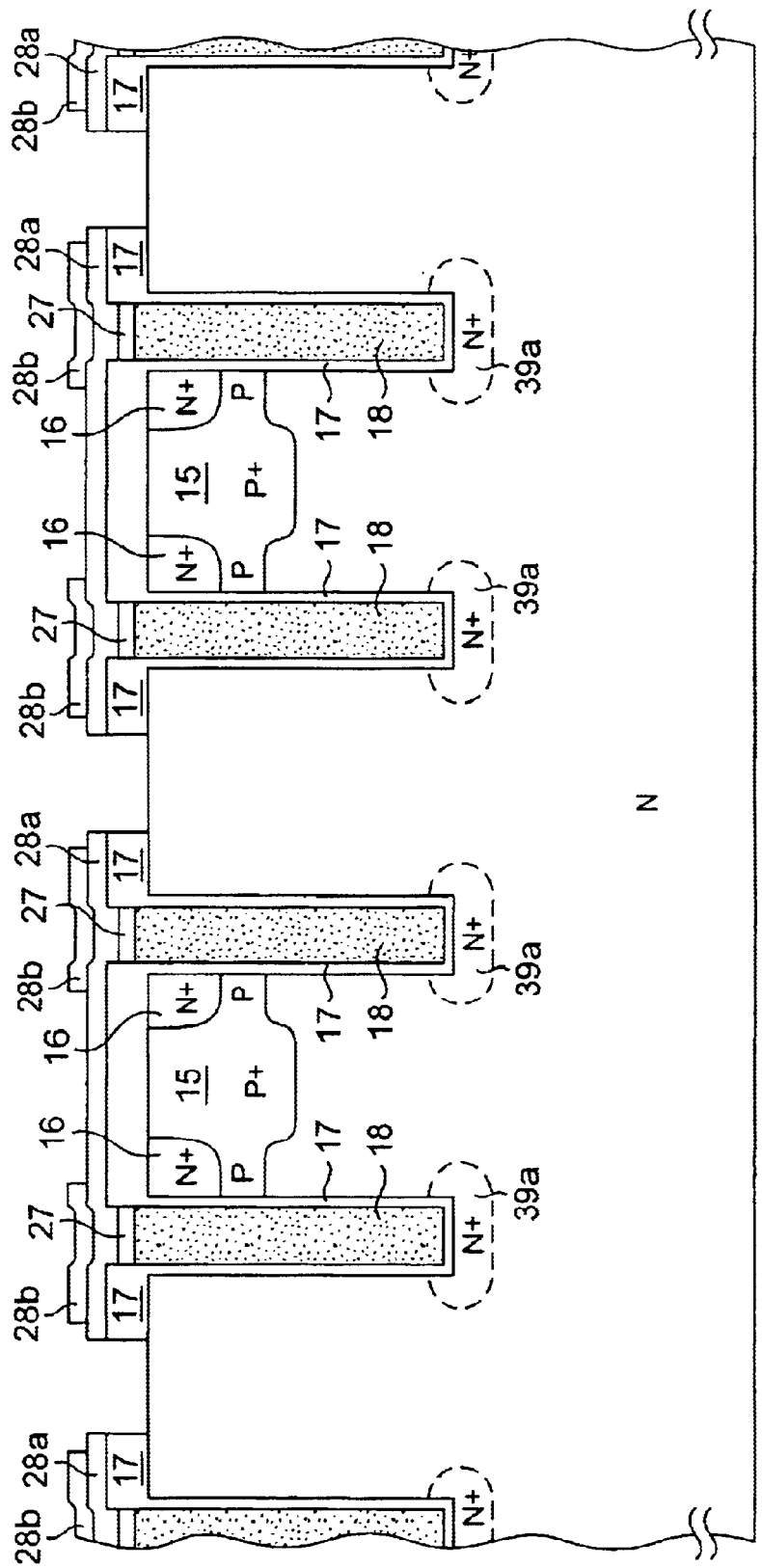

A first masking layer, such as a first silicon nitride layer, is then deposited over the structure of FIG. 11b, and a second masking layer such as silicon dioxide is deposited over the silicon nitride. This second layer is then masked and etched as is known in the art, producing a patterned masking layer 28b. Photomask and etch processes are then repeated to produce patterned masking layer 28a. The exposed silicon dioxide regions 17 are then etched through mutual apertures in the patterned masking layers 28a and 28b, while the masking layer of photoresist is still present, using a silicon dioxide etching step. The resulting structure is illustrated in FIG. 11c.

Figure 11D:
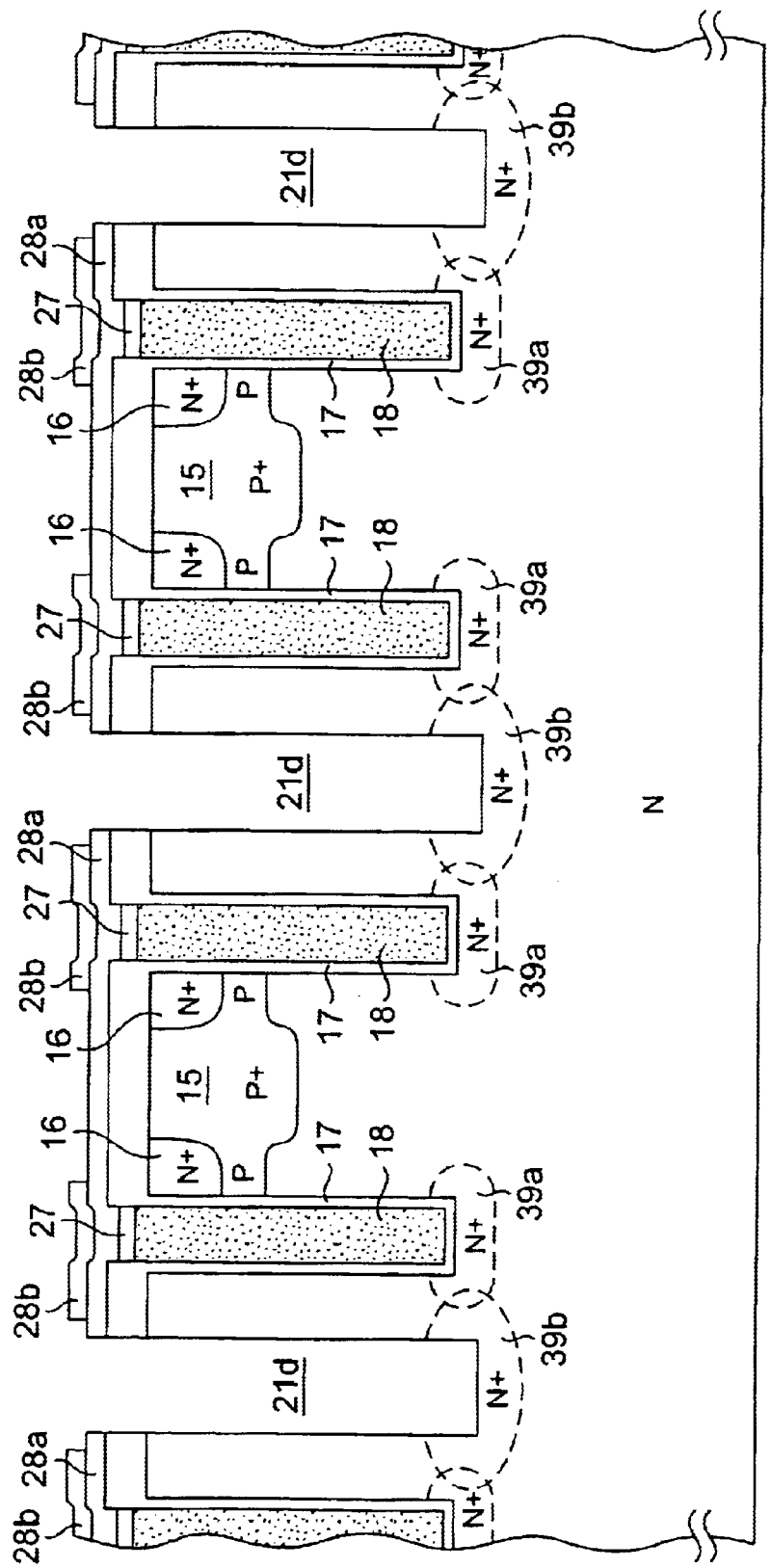

After this etching step drain access trenches 21d are then etched in the exposed silicon through the mutual apertures in the patterned masking layers 28a, 28b and silicon dioxide 17 using an anisotropic silicon etching step. Note that the drain access trenches 21d need not be of the same depth as the earlier provided gate trenches, because they are formed in separate process steps. An n-type species such as phosphorous, is then provided at the bottom of the trenches 21d by a technique such as ion implantation and diffusion, forming heavily doped regions 39b. The resulting structure is illustrated in FIG. 11d. Regions 39b overlap regions 39a. Together, regions 39a and 39b form heavily doped regions that extend from the bottom of each gate trench to an associated drain access trench.

Figure 11E:
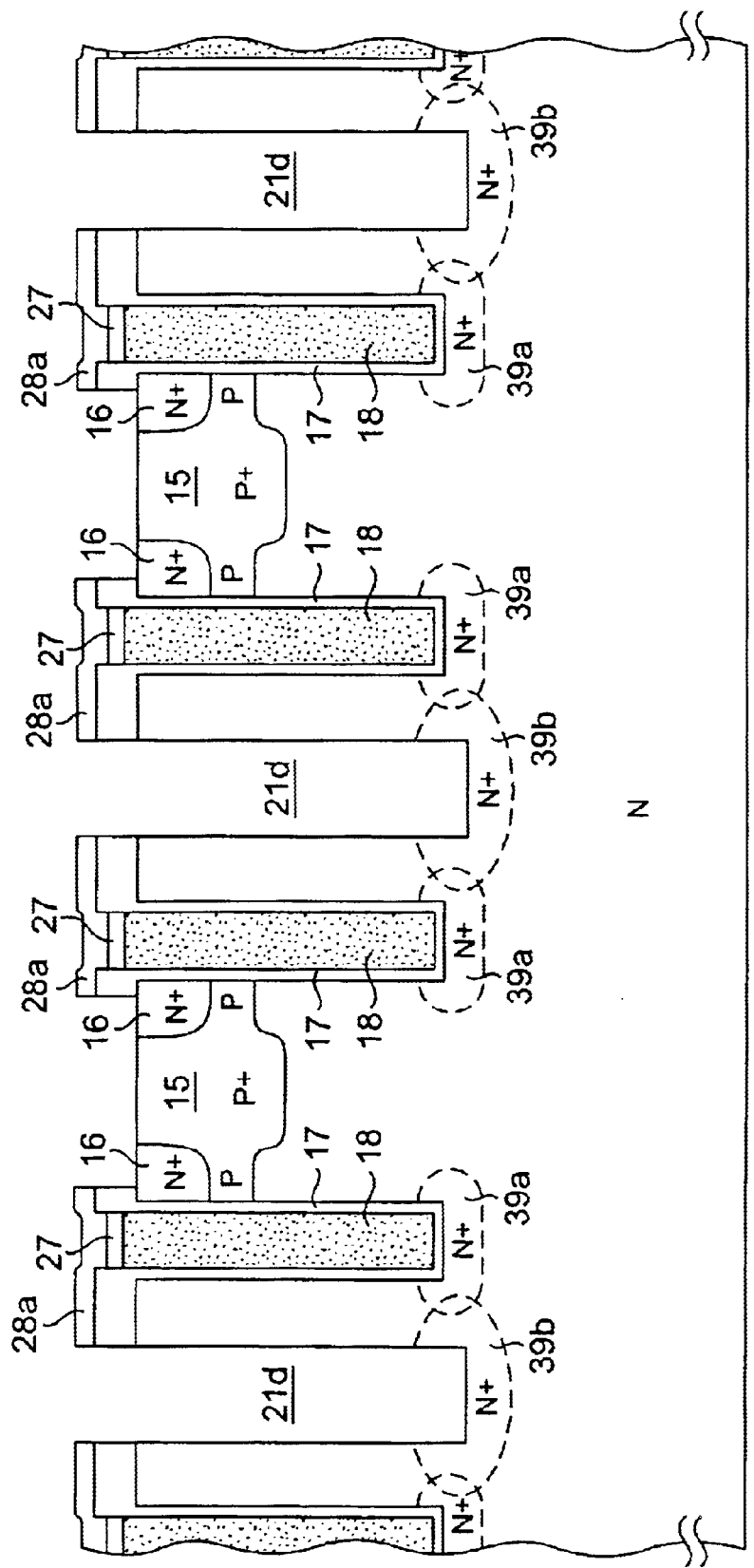

A partial silicon nitride etch is then performed, removing those portions of patterned masking layer 28a that are not covered by the patterned masking layer 28b. The remaining portions of patterned masking layers 28b and 28a are then used as a mask for a subsequent contact etching step, in which exposed portions of silicon dioxide layer 17 and 28b are removed. The resulting structure is illustrated in FIG. 11e.

Figure 11F:
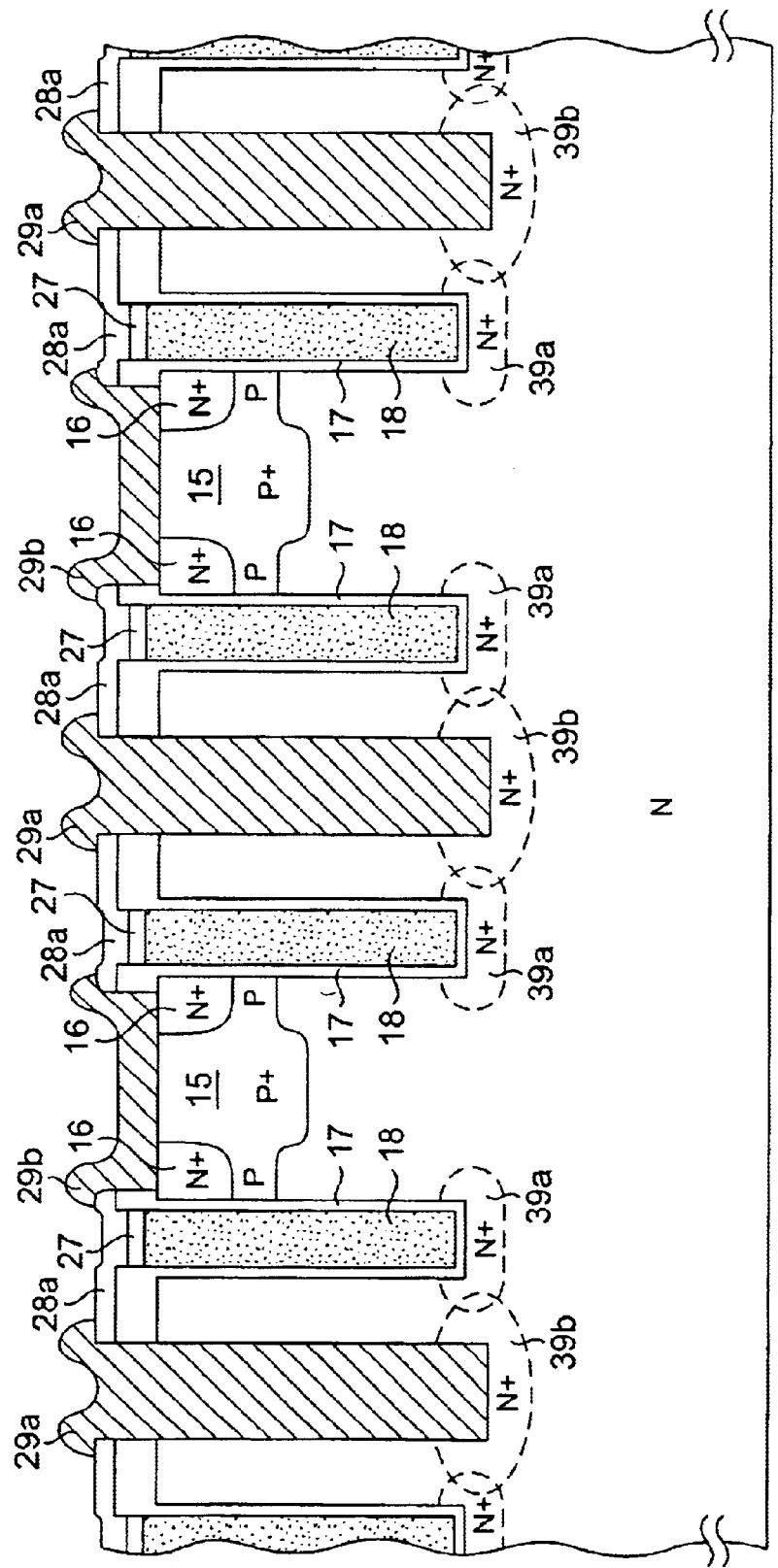

Finally, a conductive layer, for example, a metal layer, or combination of metal layers such as discussed above, is deposited over the structure, covering the surface and filling the drain access trenches 21d, using techniques known in the art to produce drain contact regions 29a and source/body contact regions 29b as illustrated in FIG. 11f, as well as a gate contact (not shown), completing the structure.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A semiconductor device comprising:
   a first region of semiconductor material of a first conductivity type, wherein said first region is non-epitaxial;
   a gate trench formed within said first region;
   a layer of gate dielectric within said gate trench;
   a gate electrode within said gate trench adjacent said layer of gate dielectric material;
   a drain access trench formed within said first region;
   a drain access region of conductive material located within said drain access trench;
   a source region of said first conductivity type within said first region, said source region being at or near a top surface of said first region and adjacent to said gate trench;
   a body region within said first region below said source region and adjacent said gate trench, said body region having a second conductivity type opposite said first conductivity type; and
   a second region of semiconductor material within said first region below said body region, said second region extending from said gate trench to said drain access trench, and said second region being of said first conductivity type and having a higher dopant concentration than said first region.

2. A semiconductor device as in claim 1, wherein said gate electrode is formed of a conductive material selected from aluminum, alloys of aluminum, refractory metals, doped polycrystalline silicon, silicides, and combinations of polycrystalline silicon and refractory metals.

3. A semiconductor device as in claim 1, wherein said first region is a semiconductor substrate.

4. A semiconductor device as in claim 1, wherein the gate trench has an octagonal mesh shape when viewed from above.

5. A semiconductor device as in claim 1 wherein said drain access trench is greater in width than said gate trench.

6. A semiconductor device as in claim 1, wherein said drain access trench is of equal or lesser width than said gate trench.

7. A semiconductor device as in claim 1, wherein said drain access region comprises doped polycrystalline silicon.

8. A semiconductor device as in claim 1, wherein said drain access region comprises a metal.

9. A semiconductor device as in claim 8, wherein said metal is selected from aluminum, refractory metals, and alloys or silicides thereof.

10. A semiconductor device as in claim 1, wherein said drain access region comprises both doped polycrystalline silicon and metal.

11. A semiconductor device as in claim 1, further comprising an oxide layer adjacent sidewalls of said drain access trench.

12. A semiconductor device as in claim 1, wherein the gate trench has a hexagonal, circular, square or rectangular mesh shape when viewed from above.

* * * * *